United States Patent
Deng

(10) Patent No.: US 11,489,101 B2
(45) Date of Patent: Nov. 1, 2022

(54) SUPERCONDUCTING CIRCUIT INCLUDING SUPERCONDUCTING QUBITS

(71) Applicant: ALIBABA GROUP HOLDING LIMITED, Grand Cayman (KY)

(72) Inventor: Hao Deng, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 64 days.

(21) Appl. No.: 16/880,270

(22) Filed: May 21, 2020

(65) Prior Publication Data

US 2020/0388745 A1 Dec. 10, 2020

(30) Foreign Application Priority Data

Jun. 6, 2019 (CN) .......................... 201910492823.3

(51) Int. Cl.
   - H01L 39/02 (2006.01)
   - H01L 39/24 (2006.01)
   - H01L 39/22 (2006.01)

(52) U.S. Cl.
   CPC .......... H01L 39/025 (2013.01); H01L 39/223 (2013.01); H01L 39/2493 (2013.01)

(58) Field of Classification Search
   CPC ....... H01L 39/025; H01L 39/06; H01L 39/24; H01L 39/223–226; H01L 39/2493–2496; H01L 27/18; H01L 39/00–2496; H01L 21/76891; H01L 35/225; G06N 10/00
   See application file for complete search history.

(56) References Cited

U.S. PATENT DOCUMENTS

| | | | |
|---|---|---|---|
| 10,243,132 B1* | 3/2019 | Rosenblatt | H01L 39/2493 |
| 2018/0062061 A1 | 3/2018 | Kirby et al. | |
| 2018/0247974 A1 | 8/2018 | Oliver et al. | |
| 2019/0042967 A1* | 2/2019 | Yoscovits | H01L 29/66977 |
| 2021/0217809 A1* | 7/2021 | Orcutt | G02B 6/12004 |

OTHER PUBLICATIONS

International Search Report and Written Opinion in International Application No. PCT/US2020/033994, dated Dec. 22, 2020 (9 pgs.).
Foxen, B., et al. "Qubit compatible superconducting interconnects." Quantum Sci. Techno. 3 104005 Nov. 30, 2017, Fig 1, section 5 Conclusion https://iopscience.iop.org/article/10.1088/2058-9565/aa94fc <DOI:10.1088/2058-9565/aa94fc>.

* cited by examiner

Primary Examiner — Shahed Ahmed
(74) Attorney, Agent, or Firm — Finnegan, Henderson, Farabow, Garrett & Dunner, LLP

(57) ABSTRACT

The present disclosure discloses a device and a method for fabricating a superconducting circuit including a superconducting qubit. The superconducting circuit comprises a bottom electrode interconnecting a superconducting qubit and a first part of the superconducting circuit. The bottom electrode comprises a bottom electrode of the superconducting qubit and a bottom electrode of the first part of the superconducting circuit. The bottom electrode of the superconducting qubit and the bottom electrode of the first part of the superconducting circuit are formed in a first superconducting layer.

7 Claims, 9 Drawing Sheets

```
                    ┌──────────────────────────────────────────────────────────────────┐
                    │  Covering a first area with a first photoresist and covering a   │
                    │ second area with a second photoresist, wherein the first area    │
                    │ includes an area where a bottom part of the superconducting      │
                    │ qubit of a to-be-prepared superconducting circuit will be        │
                    │ located, the second area includes an area where a bottom part   ├── S202
                    │ of the first part of the to-be-prepared superconducting circuit  │
                    │ will be located, and the second photoresist covers the first     │
                    │ photoresist                                                      │
                    └──────────────────────────────────────────────────────────────────┘
                                                   │
                                                   ▼
                    ┌──────────────────────────────────────────────────────────────────┐
                    │ Performing photolithography on the second photoresist to form   │
                    │ the bottom part of the first part of the superconducting       ├── S204
                    │ circuit, and exposing the first photoresist covered by the      │
                    │ second photoresist                                              │
                    └──────────────────────────────────────────────────────────────────┘
                                                   │
                                                   ▼
                    ┌──────────────────────────────────────────────────────────────────┐
                    │ Performing e-beam lithography on the exposed first photoresist  │
                    │ to form the bottom part of the superconducting qubit, and      ├── S206
                    │ depositing a bottom superconducting material on the first       │
                    │ area and the second area                                        │
                    └──────────────────────────────────────────────────────────────────┘
                                                   │
                                                   ▼
                    ┌──────────────────────────────────────────────────────────────────┐
                    │ Removing the first photoresist and the second photoresist to    │
                    │ obtain a bottom structure of the superconducting circuit,       │
                    │ wherein the bottom part of the superconducting qubit and the   ├── S208
                    │ bottom part of the first part of the superconducting circuit    │
                    │ are connected via a bottom superconducting layer formed by      │
                    │ the deposited bottom superconducting material                   │
                    └──────────────────────────────────────────────────────────────────┘
```

FIG. 2

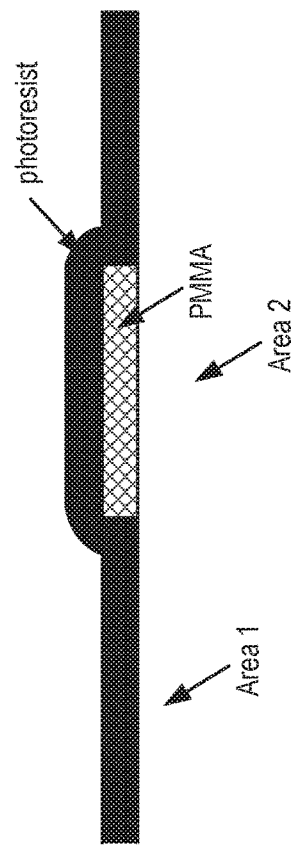
FIG. 5A a. double mask for bottom lead
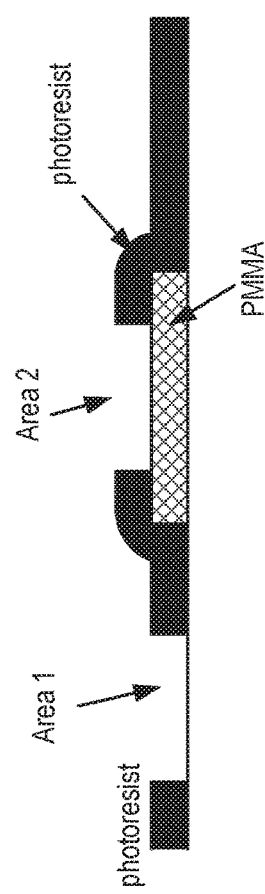
FIG. 5B b. photo lithography e. Double mask for top lead f. photo lithography

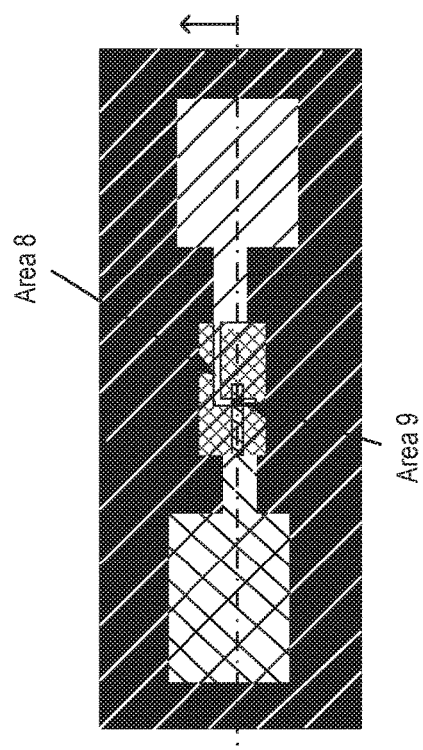
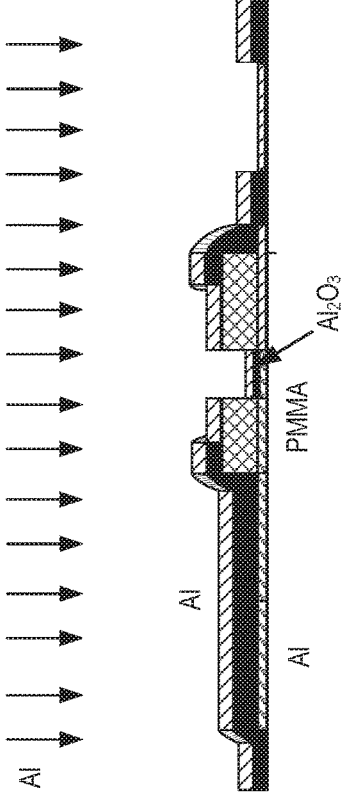
FIG. 6C
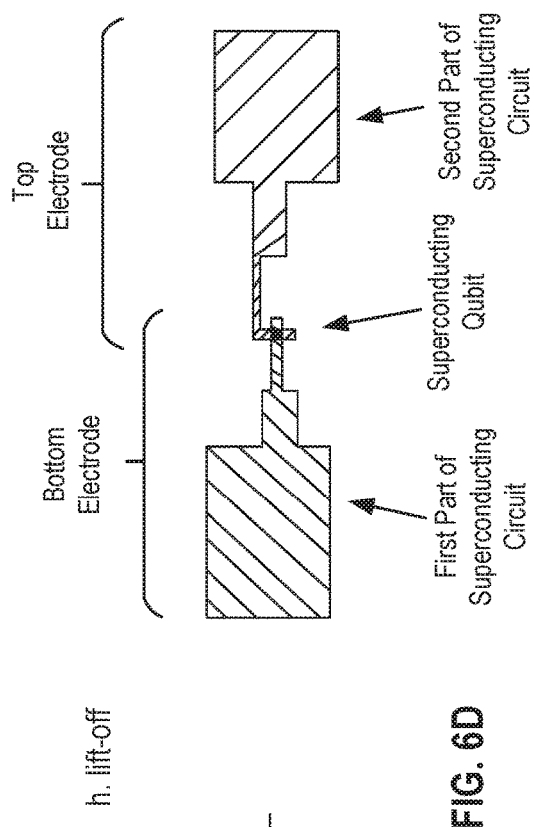
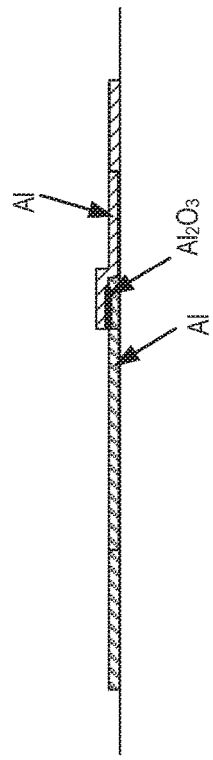
FIG. 6D

SUPERCONDUCTING CIRCUIT INCLUDING SUPERCONDUCTING QUBITS

CROSS REFERENCE TO RELATED APPLICATION

This disclosure claims the benefits of priority to Chinese application number 201910492823.3, filed Jun. 6, 2019, which is incorporated herein by reference in its entirety.

BACKGROUND

Improving hardware quality of a superconducting qubit is the key to improve a superconducting circuit and implement reliable superconducting quantum computation. When fabricating a superconducting quantum processor, because the dimension of a superconducting qubit is much smaller than other parts of the superconducting circuit, an e-beam lithography process may be used to fabricate the superconducting qubit in a separate step from fabricating other parts of the superconducting circuit using a conventional optical lithography. Accordingly, in a method of fabricating superconducting circuit including the superconducting qubit, there is an interconnection problem between the superconducting qubit and other parts of the superconducting circuit.

SUMMARY OF THE DISCLOSURE

A superconducting circuit and a preparation method thereof are provided in some embodiments of the present disclosure, so that the technical problems, such as, reduced yield of a superconducting circuit due to complex processes, and reduced performance of a superconducting qubit caused by poor electrical connection at an interface between the metals when implementing interconnection between a superconducting qubit and other part(s) of the superconducting circuit in conventional technologies can be solved.

According to some embodiments of the present disclosure, a superconducting circuit comprises a bottom electrode interconnecting a superconducting qubit and a first part of the superconducting circuit. The bottom electrode comprises a top electrode of the superconducting qubit, and a bottom electrode of the first part of the superconducting circuit.

According to some embodiments of the present disclosure, a method for preparing a superconducting circuit is further provided. The method comprises: covering a first area with a first photoresist and covering a second area with a second photoresist, wherein the first area comprises an area where a bottom electrode of a superconducting qubit of the superconducting circuit is located, the second area comprises an area where a bottom electrode of a first part of the superconducting circuit is located, and the second photoresist covers the first photoresist; performing lithography on the second photoresist to form the bottom electrode of the first part of the superconducting circuit, and to expose the first photoresist covered by the second photoresist; performing lithography on the exposed first photoresist to form the bottom electrode of the superconducting qubit; depositing first superconducting material on the first area and the second area; and removing the first photoresist and the second photoresist to obtain a bottom electrode of the superconducting circuit, wherein the bottom electrode includes the bottom electrode of the superconducting qubit and the bottom electrode of the first part of the superconducting circuit that are formed in a first superconducting layer formed by the deposited first superconducting material According to some embodiments of the present disclosure, a method for preparing a superconducting circuit is provided. The method comprises: covering a first area with a first photoresist and covering a second area with a second photoresist, wherein the first area comprises an area where a superconducting qubit of the superconducting circuit is located, the second area comprises an area where a part of the superconducting circuit is located, and the second photoresist covers the first photoresist; performing lithography on the second photoresist to form the part of the superconducting circuit, and to expose the first photoresist covered by the second photoresist; performing lithography on the exposed first photoresist to form the superconducting qubit; depositing superconducting material on the first area and the second area; and removing the first photoresist and the second photoresist to obtain the superconducting circuit, wherein the superconducting qubit and the part of the superconducting circuit are connected via a superconducting layer formed by the deposited superconducting material.

In some embodiments of the present disclosure, a superconducting qubit and other part(s) of the superconducting circuit may be interconnected via a superconducting layer formed by the deposited superconducting material (e.g., a continuous superconducting layer formed during one deposition step). Accordingly, a connection interface between metals can be eliminated, and technical benefits of integrated fabrication of the superconducting qubit and other part(s) of the superconducting circuit can be achieved. Further, simplified flow processes of the superconducting circuit can be obtained, and the performance of an electrical connection between the superconducting qubit and other part(s) of the superconducting circuit part can be improved. Therefore, the technical problems, such as reduced yield of a superconducting circuit due to complex processes, and reduced performance of a superconducting qubit caused by poor electrical connection at an interface between metals when implementing interconnection between the superconducting qubit and other part(s) of the superconducting circuit in conventional technologies may be solved.

BRIEF DESCRIPTION OF THE DRAWINGS

The drawings described here are used to provide a further understanding of the present disclosure and constitute a part of this application. The schematic embodiments of the present disclosure and the descriptions thereof are used to explain the present disclosure, and do not constitute an improper limitation to the present disclosure. In the drawings:

FIG. 2 is a flowchart of an example method for preparing a superconducting circuit according to some embodiments of the present disclosure.

FIGS. 5A-5D are schematic diagrams illustrating an example process of fabricating a bottom structure in a superconducting circuit according to some embodiments of the present disclosure.

FIGS. 6A-6D are schematic diagrams illustrating an example process of fabricating a top structure in a superconducting circuit according to some embodiments of the present disclosure.

DETAILED DESCRIPTION

Figure 1A:
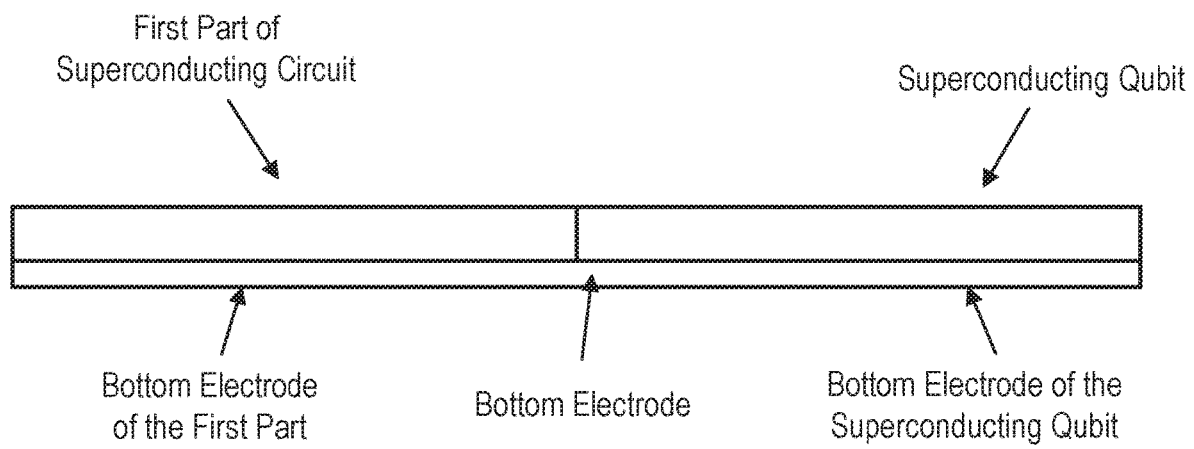
FIG. 1A is a schematic diagram of an example superconducting circuit including a bottom electrode according to some embodiments of the present disclosure.

In order to enable those skilled in the art to better understand the solutions of the present disclosure, the technical solutions in the embodiments of the present disclosure will be described clearly and completely below with reference to the drawings in the embodiments of the present disclosure. It is apparent that the described embodiments are merely some, rather than all, of the embodiments of the present disclosure. On the basis of the embodiments in the present disclosure, all other embodiments obtained by those of ordinary skill in the art without creative effort shall fall within the protection scope of the present disclosure.

It should be noted that the terms such as "first" and "second" in the description, the claims, and the aforementioned drawings of the present disclosure are used to distinguish similar objects and are not necessary to describe a specific sequence or priority. It should be understood that data used in this way are interchangeable in a suitable situation, so that the embodiments of the present disclosure described here can be implemented in a sequence other than a sequence shown or described here. In addition, terms such as "include" and "have" and any variation thereof are intended to cover non-exclusive inclusion. For example, processes, methods, systems, products, or devices including a series of steps or units are not necessarily limited to the steps or units that are clearly listed, and may include other steps or units that are not clearly listed or that are inherent to the processes, methods, products, or devices.

In a conventional method of fabricating a superconducting circuit including superconducting qubits, additional steps are performed for implementing a good interconnection between the superconducting qubits and other parts of the superconducting circuit. There are two common solutions: a patching method and a through-hole method.

In the patching method, a surface oxide layer of an overlapped portion between a superconducting qubit and another part of the superconducting circuit is removed by ion milling (e.g., a technique of thinning a material or cleaning a surface at a microscopic or nanoscopic scale by ion beam bombardment), so that a metal surface with good conductivity can be exposed. Another metal layer is then deposited on the overlapped portion to facilitate the electrical connection.

In the through-hole method, a through hole is made in an overlapped portion between the superconducting qubit and another part of the superconducting circuit by an etching method. Metal is then backfilled in the through hole to facilitate the electrical connection between the superconducting qubit and this other part of the superconducting circuit.

However, there are problems in the patching method and the through-hole method: first, additional process steps are performed, which increases the process complexity and reduces the yield of the superconducting circuit. Second, additional steps of lithography, ion milling, and etching increase the possibility of introducing defects and thus may reduce the performance of the superconducting qubit. Third, both methods result in an interface between metal connections between the superconducting qubit and another part of the superconducting circuit with poor electrical connection.

Accordingly, problems exist in interconnecting the superconducting qubit and other part(s) of the superconducting circuit, such as reduced yield of the superconducting circuit due to the complex processes, and reduced performance of the superconducting qubit caused by poor electrical connection of an interface between metals.

Interconnection between a superconducting qubit and other part(s) of the superconducting circuit (e.g., a part different from the superconducting qubit) can be fabricated using the patching method or the through-hole method as described above. However, these methods still have problems such as reduced performance of the superconducting qubit due to the complex processes and poor electrical connection at the interface between metals. The present disclosure provides a superconducting circuit, where a superconducting qubit and other part(s) of the superconducting circuit are integratedly prepared, to implement a contactless connection between the superconducting qubit and other part(s) of the superconducting circuit. The disclosed embodiments not only simplify the flow processes for fabricating the superconducting circuit, but also improves the performance of the electrical connection between the superconducting qubit and other part(s) of the superconducting circuit. Accordingly, the technical problems as described above in the conventional processes, e.g., reduced yield of a superconducting circuit due to complex processes, and reduced performance of a superconducting qubit caused by poor electrical connection at an interface between metals, can be effectively solved.

Figure 1B:
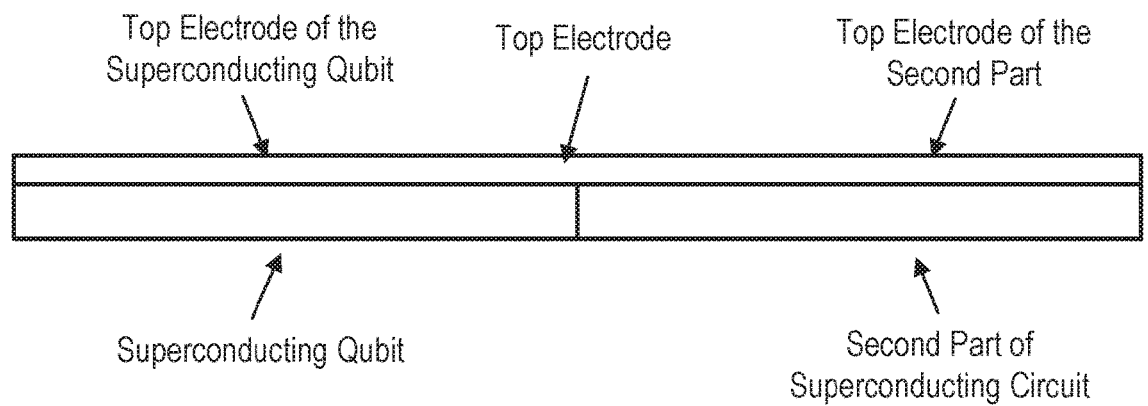
FIG. 1B is a schematic diagram of an example superconducting circuit including a top electrode according to some embodiments of the present disclosure.

FIG. 1A is a schematic diagram of an example superconducting circuit including a bottom electrode according to some embodiments of the present disclosure. FIG. 1B is a schematic diagram of an example superconducting circuit including a top electrode according to some embodiments of the present disclosure. In some embodiments, the superconducting circuit is a superconducting quantum circuit. In some embodiments, the superconducting quantum circuit includes a classical superconducting circuit part and a superconducting qubit part. For example, the superconducting quantum circuit includes a superconducting qubit interconnected with one or more other parts of the superconducting circuit, such as a first part of the superconducting circuit as illustrated in FIG. 1A, 5D or 6D, or a second part of the superconducting circuit as illustrated in FIG. 1B or 6D. In some embodiments, other part(s) of the superconducting circuit different from the superconducting qubit may also be referred to as a classical superconducting part, a non-qubit part of the superconducting circuit, a remaining part of the superconducting circuit. In some embodiments, the superconducting qubit is at a microscopic scale (e.g., from several to hundreds of micrometers) or nanoscopic scale (e.g., from server nanometers to hundreds of nanometers). In some embodiments, the first part or the second part of the superconducting circuit is at a macroscopic scale that is greater than the microscopic or nanoscopic scale. The present disclosure describes a contactless method using double masks for an integrated fabrication of the superconducting circuit to avoid the interconnection problems in the conventional methods.

As shown in FIG. 1A, the superconducting quantum circuit includes a bottom structure, such as a bottom electrode. In some embodiments, the bottom structure includes a bottom part, e.g., a bottom electrode, of the superconducting qubit and a bottom part, e.g., a bottom electrode, of the first part of the superconducting circuit. In some embodiments, the bottom electrode of the superconducting qubit part and the bottom electrode of the first part of the superconducting circuit are formed in a bottom superconducting layer, e.g., a continuous superconducting layer, formed in one deposition process.

In some embodiments, the bottom structure includes the bottom electrode of the superconducting qubit and the bottom electrode of the first part of the superconducting circuit. In some embodiments, the bottom electrode of the superconducting qubit may be a circuit part of the superconducting qubit in the bottom structure. The bottom electrode of the first part of the superconducting circuit may be a circuit part of the bottom layer of the first part of the superconducting circuit. The bottom part of the superconducting qubit may be prepared from the superconducting qubit in the bottom structure of the superconducting circuit. In some embodiments, the superconducting qubit is a quantum system with discrete energy levels based on quantum mechanics as a theoretical basis. The superconducting qubit may include a Josephson junction as a basic carrier. The bottom part of the first part of the superconducting circuit may be prepared from the first part of the superconducting circuit in the bottom structure of the superconducting circuit. In some embodiments, the first part of the superconducting circuit is a classical superconducting circuit different from the superconducting qubit.

In some embodiments, the bottom electrode may include a superconducting layer including any suitable material, for example, a metal layer or a superconducting compound layer. In some embodiments, the metal layer or the superconducting compound layer may include one or more suitable materials, such as aluminum (Al), niobium (Nb), niobium nitride (NbN), and titanium nitride (TiN). It is appreciated that aluminum, niobium, niobium nitride, and titanium nitride listed here are examples for illustration. The metal layer or the superconducting compound layer can include any other suitable materials.

In some embodiments as shown in FIG. 1B, the superconducting circuit further includes a top structure, such as a top electrode. In some embodiments, the top structure may include a top part, e.g., a top electrode, of the superconducting qubit and a top part, e.g., a top electrode, of a second part of the superconducting circuit. In some embodiments, the top electrode of the superconducting qubit and the top electrode of the second part of the superconducting circuit are formed in a top superconducting layer e.g., a continuous superconducting layer, formed in one deposition.

In some embodiments, the top structure includes the top electrode of the superconducting qubit and the top electrode of the second part of the superconducting circuit. In some embodiments, the top electrode of the superconducting qubit may be a circuit part of the superconducting qubit in the top structure. The top electrode of the second part of the superconducting circuit part may be a circuit part of the second part of the superconducting circuit in the top structure. The top part of the superconducting qubit may be prepared from the superconducting qubit in the top structure of the superconducting circuit. In some embodiments, the superconducting qubit is a quantum system with discrete energy levels based on quantum mechanics as a theoretical basis. The superconducting qubit may include a Josephson junction as a basic carrier. The top part of the second part of the superconducting circuit part may be prepared from the second part of the superconducting circuit in top structure of the superconducting circuit. In some embodiments, the second part of the superconducting circuit is a classical superconducting circuit different from the superconducting qubit.

In some embodiments, the top electrode may include a superconducting layer including any material, for example, a metal layer or a superconducting compound layer. The material of the metal layer or the superconducting compound layer may include one or more suitable materials, such as aluminum, niobium, niobium nitride, or titanium nitride. It is appreciated that aluminum, niobium, niobium nitride, or titanium nitride listed here are examples for illustration. The metal layer or the superconducting compound layer can include any other suitable materials.

In some embodiments, the superconducting circuit includes a bottom electrode, a top electrode, and an insulation layer provided at an overlapped portion between the bottom structure and the top structure. The insulation layer may include any suitable type of materials, for example, an oxide such as aluminum oxide ($Al_2O_3$) etc.

In some embodiments, the superconducting qubit and the first part or the second part of the superconducting circuit may be connected via a superconducting layer (e.g., a continuous superconducting layer) formed by depositing superconducting material (e.g., formed in one deposition). By connecting the superconducting qubit part and the first part or the second part of the superconducting circuit via the superconducting layer, a connection interface between metals can be eliminated. As such, an integrated fabrication of the superconducting qubit and the first part or the second part of the superconducting circuit can be achieved with not only simplified processes for fabricating the superconducting circuit, but also improved performance of an electrical connection between the superconducting qubit and the first part or second part of the superconducting circuit. Accordingly, the technical problems in the conventional methods, such as reduced yield of a superconducting circuit due to complex processes, and reduced performance of a superconducting qubit caused by poor electrical connection at an interface between metals can be solved.

FIG. 2 is a flowchart of an example method for preparing a superconducting circuit according to some embodiments of the present disclosure. In some embodiments, the method for preparing the superconducting circuit is a contactless method, thereby providing an integrated fabrication of the superconducting qubit and other part(s) of the superconducting circuit to avoid interconnection problems. As shown in FIG. 2, the flow includes the following steps.

In step S202, a first area is covered with a first photoresist and a second area is covered with a second photoresist. In some embodiments, the first area includes an area where a bottom part of the superconducting qubit part of a superconducting circuit will be located. In some embodiments, the second area includes an area where a bottom part of the first part of the superconducting circuit will be located. In some embodiments, the second photoresist covers the first photoresist.

In some embodiments, in step S202, the first photoresist may be used to cover the bottom part of the superconducting qubit of the superconducting circuit. The second photoresist may be used to cover the bottom part of the first part of the superconducting circuit. The first photoresist may be covered with the second photoresist.

In some embodiments, the first photoresist may include any suitable types of photoresist used for preparing the bottom part of the superconducting qubit. For example, the first photoresist includes an e-beam lithography photoresist. In some embodiments, the second photoresist may include any suitable types of photoresist used for preparing the bottom part of the first part of the superconducting circuit. For example, the second photoresist includes an optical photoresist. It is appreciated that the e-beam lithography photoresist is used as an example of the first photoresist for preparing the bottom part of the superconducting qubit, and the optical photoresist is used as an example of the second photoresist for preparing the bottom part of the first part of the superconducting circuit. The first photoresist and second photoresist are not limited to the examples as described in the present disclosure.

In step S204, the bottom part of the first part of the superconducting circuit is formed via lithography (e.g., e-beam lithography or photolithography) on the second photoresist. Further, the first photoresist covered by the second photoresist is exposed (e.g., via photolithography).

In some embodiments, various techniques may be used when the bottom part of the first part of the superconducting circuit is formed through photolithography on the second photoresist. For example, at least one of the following processes may be used to perform photolithography on the second photoresist to form the bottom part of the first part of the superconducting circuit part: a lift-off process, a wet etching process, and a dry etching process. The lift-off, wet etching, and dry etching can be used for forming a pattern on a target layer. The above three processes are described below briefly using a superconducting metal layer, e.g., Al, as the target layer.

In the lift-off process, a photoresist layer is first prepared on a substrate. A pattern is then defined by exposing the photoresist layer to a pattern of light, and the pattern is formed on the substrate after developing. Then an Al layer is deposited, and the photoresist is finally removed by chemical dissolution. For areas where the substrate is not exposed after developing, Al is deposited onto the surface of the photoresist, and is removed together with the photoresist by chemical dissolution. For areas where the substrate is exposed after developing, because Al is directly attached to the substrate, Al is not affected by photoresist removal and is retained on the substrate to form the designed pattern.

Some steps in wet etching and dry etching are in reversed sequence to those in the lift-off process. For example, in these two processes, an Al layer is first deposited on a substrate, a photoresist layer is then prepared on the Al layer. A pattern is defined by exposing the photoresist layer on the substrate to a pattern of light, and the regions to be removed are exposed on the Al layer after developing. The substrate is then placed in a chemical environment corrosive to Al. For the regions where Al is exposed after developing, Al is etched away. For areas where Al is not exposed (e.g., covered by photoresist) after developing, Al is not affected because of the protection by the photoresist. The difference between the wet etching process and the dry etching process includes using different chemical corrosives to remove Al. In the wet etching process, a particular chemical solution (such as an acid solution) is used to etch away the exposed Al layer, and the process is therefore referred to as wet etching. In the dry etching process, a particular chemical gas and plasma (such as chlorine) are used to etch away the exposed Al layer, and the process is therefore referred to as dry etching.

It is appreciated that the lift-off technique is a complete process for preparing patterns, and does not only include the process for "removing photoresist" as described in the present disclosure. In some embodiments of the present disclosure, large-scale (e.g., macroscopic scale) and small-scale (e.g., microscopic scale or nanoscopic scale) patterns are prepared by double masks at the same time to obtain an integrated structure without an additional interface layer. The patterns are defined by lithography (e.g., photolithography). The method of the present disclosure is applicable to the lift-off, wet etching, and dry etching. In some embodiments of the present disclosure, the pattern is illustrated using the lift-off process as an example.

In step S206, the bottom part of the superconducting qubit is formed using lithography (e.g., e-beam lithography) on the exposed first photoresist (e.g., obtained in step S204). Further, a bottom superconducting material is deposited on the first area and the second area.

In some embodiments, various methods may be used to form the bottom part of the superconducting qubit via lithography on the exposed first photoresist. For example, the bottom part of the superconducting qubit may be formed through e-beam lithography on the exposed first photoresist using at least one of the following methods: overlap technique and shadow evaporation technique. It is appreciated that some steps of the overlap technique and the shadow evaporation technique may be used to form the bottom part of the superconducting qubit. Some other steps of the overlap technique and the shadow evaporation technique may be used to prepare the top structure of the superconducting circuit (e.g., FIG. 1B), for example, as described with reference to the process of "performing lithography on the exposed third photoresist to form the top part of the superconducting qubit" in S406. As such, the complete overlap technique and shadow evaporation technique may be performed.

In some embodiments, the overlap technique and the shadow evaporation technique can be used for fabricating a Josephson junction. During fabrication of a Josephson junction, two layers of superconductors (e.g., using Al as an example in some embodiments of the present disclosure) are at least partially overlapped. An insulation layer (e.g., using $Al_2O_3$ as an example in some embodiments of the present disclosure) may be formed on the overlapped portion for isolation. Therefore, the overlap method or the shadow evaporation method can be used for manufacturing a "superconducting-insulating-superconducting" structure. These two methods are briefly described below.

In the overlap technique, the shape of a bottom Al electrode can first be prepared using a conventional lithography and deposition technique. $Al_2O_3$ is then prepared on the surface of the Al layer as an insulation layer (for example, using in-situ oxidation). The shape of a top Al electrode is also prepared by the lithography and deposition technique. The top Al electrode and the bottom Al electrode may have an overlap. For example, the overlap may be formed in a cross shape. A Josephson junction can be formed at the overlap portion. In the overlap technique, the lithography and deposition process may be performed twice.

Figure 3:
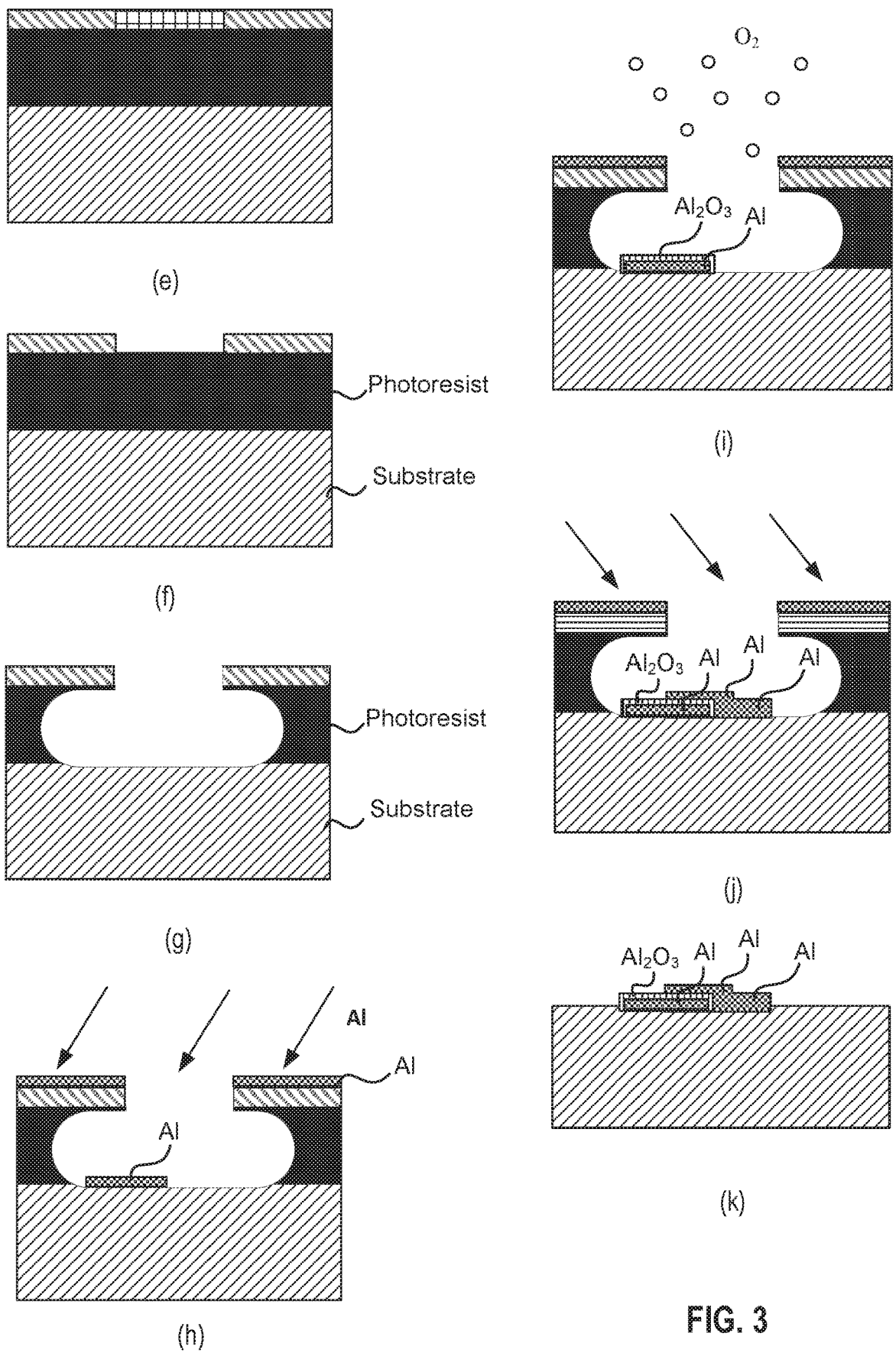
FIG. 3 shows example schematic diagrams illustrating some steps in a shadow evaporation technique according to some embodiments of the present disclosure.

FIG. 3 shows example schematic diagrams illustrating some steps in a shadow evaporation technique according to some embodiments of the present disclosure. As shown in FIG. 3, first, photoresist patterns with a certain height are made via lithography (e.g., as shown in subfigures (e) and (f)). In some embodiments, a patterned top layer may be formed on the photoresist layer and used as a mask for patterning the photoresist layer. The patterned photoresist layer may be used to expose a part of the substrate (e.g., as shown in subfigure (g)). Al is then deposited from a certain angle (e.g., as shown in subfigure (h)). Due to the shadow effect of the photoresist patterns, Al is deposited on a first portion of the exposed part of the substrate (e.g., subfigure (h)). An $Al_2O_3$ insulation layer is then formed on the surface of the deposited Al layer via in-situ oxidation (e.g., subfigure (i)). Subsequently, Al may be deposited from another angle (e.g., different from the deposition angle used in subfigure (h)). Due to the shielding effect (or shadow effect), Al may be deposited on a second portion of the exposed part of the substrate (e.g., subfigure (j)). In some embodiments, by calculating the different angles used for the two Al depositions, the first portion with the Al deposition may partially overlap with the second portion with the Al deposition (e.g., as shown in subfigure (j)). In some embodiments, the first and second portions of Al depositions may be separated at the overlapped area via the $Al_2O_3$ insulation layer. Accordingly, after removing the photoresist layer, a Josephson junction is formed at the overlapped area between the first and second portions (e.g., as shown in subfigure (k)). Because depositing Al layers from different angles and forming $Al_2O_3$ via in-situ oxidation can be performed sequentially in the same device, the "lithography and deposition" process can be performed once using the shadow evaporation technique.

It is appreciated that both the overlap technique and the shadow evaporation technique are used for preparing a Josephson junction. Both methods are used to prepare tiny structures (e.g., at nanoscopic or microscopic scale), and accordingly may be implemented on an e-beam photoresist using electron beam (e.g., e-beam) lithography. In some embodiments of the present disclosure, the overlap technique and the shadow evaporation technique can be used to perform lithography (e.g., e-beam lithography) on the first/third photoresist to form the bottom/top part of the superconducting qubit. In some embodiments of the present disclosure, the figures are described using the overlap technique as an example. Some embodiments of the present disclosure provide a technical solution capable of preparing large-scale and small-scale structures at the same time with an integrated structure and without an additional interface layer. The present disclosure is compatible with various techniques for preparing large or small scale structures, such as, the above-described lift-off technique, wet etching technique, dry etching technique, the overlap technique, the shadow evaporation technique, etc.

In some embodiments, the bottom superconducting material may include various types of superconducting materials, for example, aluminum, niobium, niobium nitride, or titanium nitride, etc.

In step S208, the first photoresist and the second photoresist are removed to obtain a bottom structure of the superconducting circuit, wherein the bottom part of the superconducting qubit and the bottom part of the first part of the superconducting circuit are connected via the same bottom superconducting layer formed by the deposited bottom superconducting material. For example, the bottom electrode of the superconducting qubit and the bottom electrode of the first part of the superconducting circuit are formed in a continuous bottom superconducting layer in one deposition step.

In some embodiments, the first photoresist and the second photoresist may be removed using the above-described lift-off technique.

In some embodiments, the bottom part of the superconducting qubit and the bottom part of the first part of the superconducting circuit are formed in a bottom superconducting layer formed by depositing the bottom superconducting material. By connecting the bottom part of the superconducting qubit and the bottom part of the first part of the superconducting circuit via the bottom superconducting layer, a connection interface between the metals of the bottom part of the superconducting qubit and the bottom part of the first part of the superconducting circuit can be eliminated, so as to implement an integrated fabrication of the bottom part of the superconducting qubit and the bottom part of the first part of the superconducting circuit. Accordingly, not only the flow processes of fabricating the bottom structure of the superconducting circuit can be simplified, the performance of an electrical connection between the superconducting qubit and the first part of the superconducting circuit part in the bottom structure of the superconducting circuit can also be improved.

Figure 4:
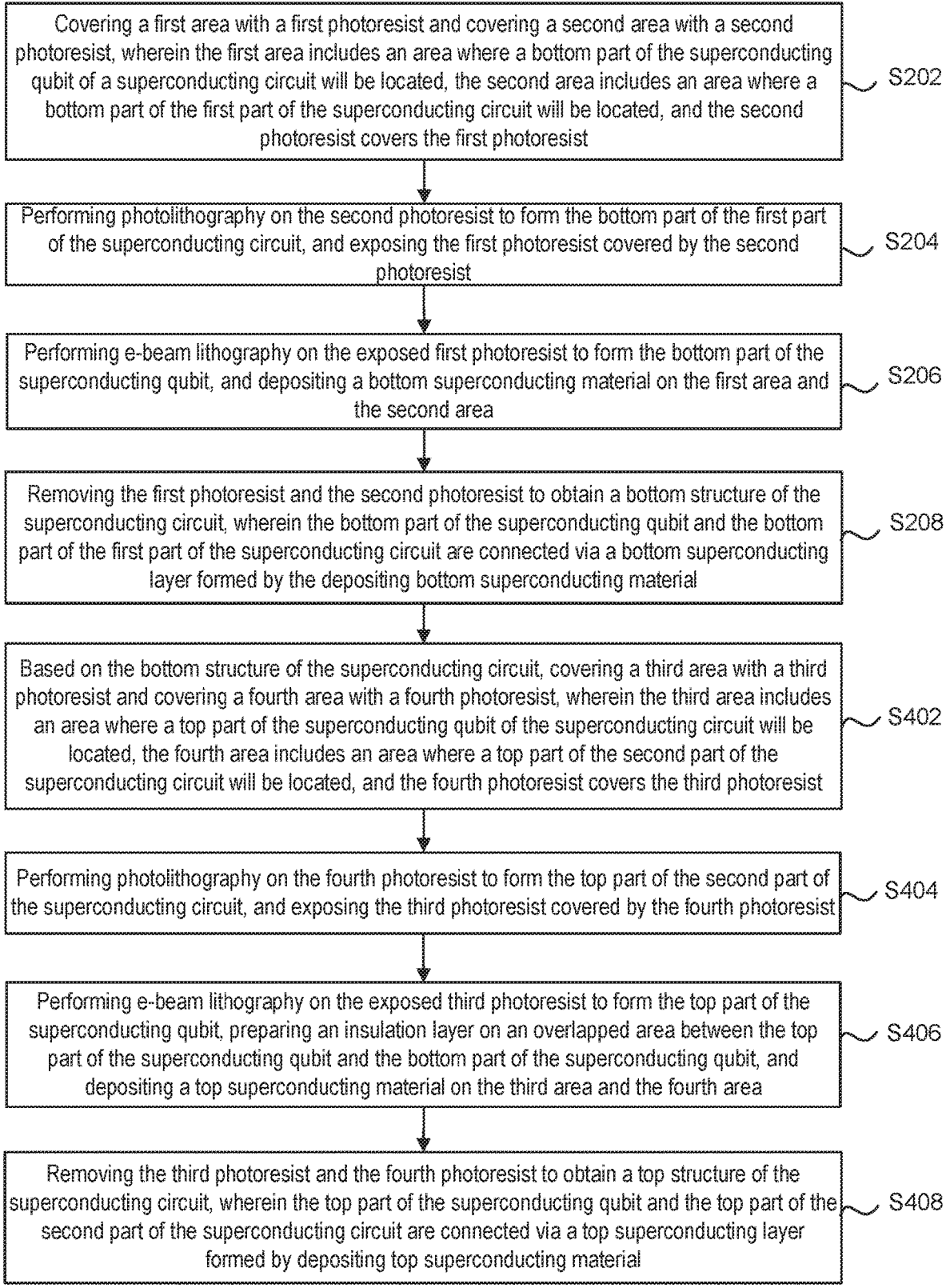
FIG. 4 is a flowchart of an example method for preparing a superconducting circuit according to some embodiments of the present disclosure.

In some embodiments, the superconducting circuit also includes a top structure, and the top structure of the superconducting circuit can be prepared using the similar method for fabricating the bottom structure as described above. The method for preparing the top structure of the superconducting circuit is described below. FIG. 4 is a flowchart of an example method for preparing a superconducting circuit according to some embodiments of the present disclosure. As shown in FIG. 4, the method includes steps S202-S208 from a method as described in FIG. 2, and additional steps S402-S408. For the sake of brevity, steps S202-S208 are not repeated.

In step S402, based on the bottom structure of the superconducting circuit (e.g., obtained in step S208), a third area is covered with a third photoresist and a fourth area is covered with a fourth photoresist, wherein the third area includes an area where a top part of the superconducting qubit of the superconducting circuit will be located, the fourth area includes an area where a top part of the second part of the superconducting circuit will be located, and the fourth photoresist covers the third photoresist.

In some embodiments, in step S402, the third photoresist may be used to cover the top part of the superconducting qubit of the superconducting circuit, the fourth photoresist is used to cover the top part of the second part of the superconducting circuit, and the third photoresist is covered by the fourth photoresist.

In some embodiments, the third photoresist may include various types of photoresist used for preparing the top part of the superconducting qubit, for example, an e-beam lithography photoresist. The fourth photoresist may include various types of photoresist used for preparing the top part of the second part of the superconducting circuit, for example, an optical photoresist. It is appreciated that the e-beam lithography photoresist is an example of the photoresist for preparing the top part of the superconducting qubit, the optical photoresist is an example of the photoresist for preparing the top part of the second part of the superconducting circuit, and the third photoresist and fourth photoresist are not limited to the examples as described in the present disclosure and can include any other suitable material.

In step S404, the top part of the second part of the superconducting circuit is formed through lithography (e.g., photolithography) performed on the fourth photoresist, and the third photoresist covered by the fourth photoresist is exposed (e.g., via photolithography).

In some embodiments, various suitable techniques may be used when the top part of the second part of the superconducting circuit is formed through lithography performed on the fourth photoresist. For example, the top part of the second part of the superconducting circuit may be formed through photolithography performed on the fourth photoresist using at least one of the following method: lift-off technique, wet etching technique, or dry etching technique. It is appreciated that the lift-off, wet etching, or dry etching techniques are similar to the techniques used for performing lithography on the second photoresist to form the bottom part of the first part of the superconducting circuit when preparing the bottom structure of the superconducting circuit, and the details are not repeated for the sake of brevity.

In step S406, the top part of the superconducting qubit is formed by lithography (e.g., e-beam lithography) on the exposed third photoresist, an insulation layer is prepared on an overlapped area between the top part of the superconducting qubit and the bottom part of the superconducting qubit, and a top superconducting material is deposited on the third area and the fourth area.

In some embodiments, various techniques may be used when the top part of the superconducting qubit is formed via lithography performed on the exposed third photoresist. For example, the top part of the superconducting qubit may be formed by performing e-beam lithography on the exposed third photoresist using at least one of the following method: overlap technique or shadow evaporation technique. It is appreciated that the overlap technique or the shadow evaporation technique is similar to the techniques used for performing lithography on the exposed first photoresist to form the bottom part of the superconducting qubit when preparing the bottom structure of the superconducting circuit.

In some embodiments, different from preparing the bottom structure of the superconducting circuit, when a top structure of the superconducting circuit is prepared based on the bottom structure of a quantum circuit, an insulation layer is prepared on an overlapped area between the top part of the superconducting qubit and the bottom part of the superconducting qubit. The insulation layer is used to form a Josephson junction of a superconducting qubit, and may include multiple forms. In some embodiments, the insulation layer may include various types of materials, for example, an oxide such as aluminum oxide ($Al_2O_3$). Various methods can be used to prepare the insulation layer, for example, in-situ oxidation.

In some embodiments, the bottom superconducting material may include various types of superconducting materials such as aluminum, niobium, niobium nitride, or titanium nitride. The top superconducting material may include various types of superconducting materials such as aluminum, niobium, niobium nitride, or titanium nitride. In some embodiments, the bottom superconducting material and the top superconducting material may be the same or different, and may be flexibly selected according to specific requirements.

In step S408, the third photoresist and the fourth photoresist are removed to obtain a top structure of the superconducting circuit, wherein the top part of the superconducting qubit and the top part of the second part of the superconducting circuit are connected via the same top superconducting layer formed by depositing top superconducting material. For example, the top electrode of the superconducting qubit and the top electrode of the second part of the superconducting circuit are formed in a continuous bottom superconducting layer in one deposition step.

In some embodiments, the third photoresist and the fourth photoresist may be removed using the above-described lift-off technique.

In some embodiments, the top part of the superconducting qubit and the top part of the second part of the superconducting circuit are formed in a top superconducting layer formed by depositing the top superconducting material. By connecting the top part of the superconducting qubit and the top part of the second part of the superconducting circuit via the top superconducting layer, a connection interface between the metals of the top part of the superconducting qubit and the top part of the second part of the superconducting circuit can be eliminated, so as to implement an integrated fabrication of the top part of the superconducting qubit and the top part of the second part of the superconducting circuit. Accordingly, not only the flow processes of fabricating the top structure of the superconducting circuit can be simplified, the performance of an electrical connection between the superconducting qubit and the second part of the superconducting circuit part in the top structure of the superconducting circuit can also be improved.

In some embodiments, the superconducting circuit is obtained by combining the preparation of the bottom structure of the superconducting circuit with the preparation of the top structure of the superconducting circuit. FIGS. 5A-5D are schematic diagrams illustrating an example process of fabricating a bottom structure in a superconducting circuit according to some embodiments of the present disclosure. FIGS. 6A-6D are schematic diagrams illustrating an example process of fabricating a top structure in a superconducting circuit according to some embodiments of the present disclosure. These embodiments provide an integrated fabrication of a microscopic or nanoscopic structure (e.g., the superconducting qubit part) and a macroscopic structure (e.g., the first part or second part of the superconducting circuit part) using a double mask technique, so as to avoid interconnection problems between the superconducting qubit part and the first part or second part of the superconducting circuit part. In some embodiments, the methods as illustrated in FIGS. 5A-5D and FIGS. 6A-6D include the following processes. It is noted that each set of figures of FIGS. 5A-5D and 6A-6D includes a cross-sectional view of the superconducting circuit on the left and a corresponding top view of the superconducting circuit on the right.

As shown in FIG. 5A, a double mask structure of a bottom electrode (e.g., of the superconducting qubit) is prepared. In some embodiments, the microscopic or nanoscopic (micrometer or nanometer) scale part (e.g., area 2, corresponding to the superconducting qubit) is covered with an e-beam lithography photoresist (using polymethylmethacrylate (PMMA) as an example in the figure). In some embodiments, the macroscopic scale part (e.g., area 1, corresponding to the first part of the superconducting circuit) is covered with an optical photoresist (e.g., sensitive to UV light or other short-wavelength light). In some embodiments, the e-beam lithography photoresist may be covered by the optical photoresis as shown in FIG. 5A.

In some embodiments as shown in FIG. 5B, the macroscopic scale structure interconnected with the bottom electrode may be defined by photolithography, for example, by exposing and developing a pattern on the optical photoresist to expose area 1. In some embodiments, area 2 on the e-beam lithography photoresist may also be exposed (e.g., for preparing the pattern corresponding to the superconducting qubit in the following steps). In some embodiments, an interconnecting area 3 that connects area 1 and area 2 may also be exposed as shown in the top view on the right of FIG. 5B. In some embodiments, area 1, area 2, and the interconnecting area 3 between area 1 and area 2 may be exposed at the same time in one photolithography process.

Figure 5C:
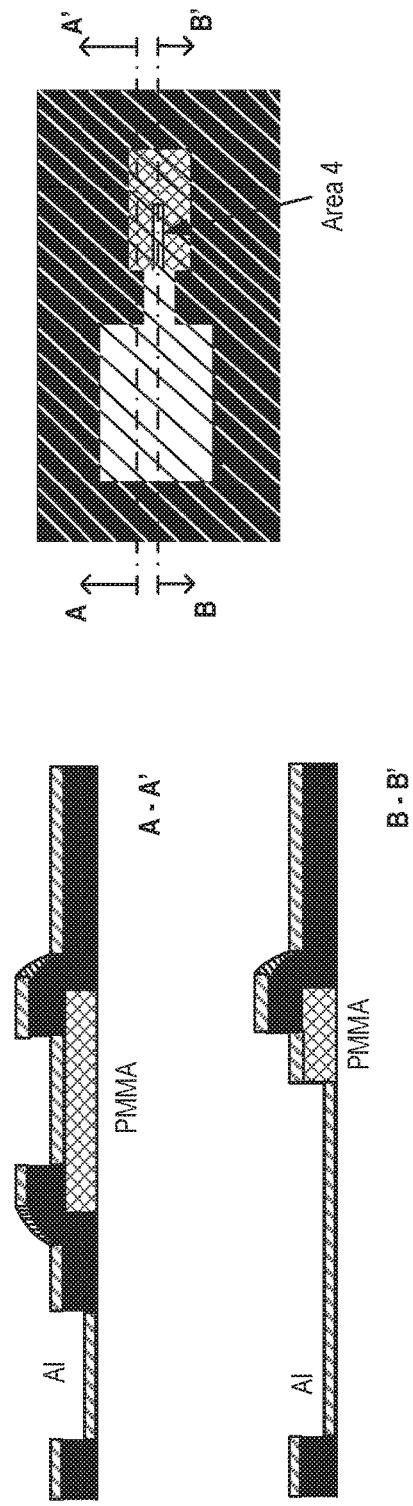
Figure 5D:

In some embodiments as shown in FIG. 5C, the location and pattern of the bottom electrode (e.g., may also be referred to as the bottom part) of the microscopic or nanoscopic structure (e.g., the superconducting qubit) may be defined using e-beam lithography. For example, as shown in the top view on the right of FIG. 5C, a portion of the e-beam lithography photoresist is removed to expose area 4 (e.g., contained within area 2) corresponding to the bottom part of the superconducting qubit. After the e-beam lithography process, a bottom electrode metal (using Al as an example in the figure) may be deposited. As shown in the cross-sectional view along line A-A', the deposited metal covers the remaining photoresist (e.g., optical photoresist), area 1 (via direct contact), and area 2 (covering the e-beam lithography photoresist in area 2). In the cross-sectional view along line B-B', the deposited metal covers the remaining photoresist and areas 1, 3, and 4 via direct contact. It is appreciated that the bottom part (e.g., area 4) of the microscopic or nanoscopic structure part (e.g., the superconducting qubit) and the bottom part (e.g., area 1) of the macro-structure part (e.g., the first part of the superconducting circuit) are interconnected and formed in a superconducting layer (e.g., a continuous metal layer formed at the same time during the deposition process). Accordingly, there is no contact interface formed between metals of the superconducting qubit and the first part of the superconducting circuit as described in the conventional problems.

In some embodiments as shown in FIG. 5D, the optical photoresist and the e-beam lithography photoresist are removed and a bottom electrode pattern can be fabricated by a lift-off process. In some embodiments, after the metal deposition and lift-off processes, area 1 corresponding to the bottom electrode of the first part of the superconducting circuit (e.g., illustrated in FIG. 5B), the interconnecting area 3 between area 1 and area 2 (e.g., illustrated in FIG. 5B), and area 4 corresponding to the bottom electrode of the superconducting qubit (e.g., illustrated in FIG. 5C) are exposed as a deposited superconducting layer (e.g., Al). As discussed above, area 1, area 3, and area 4 are formed as a continuous metal layer at the same time during the metal deposition process as described in FIG. 5C.

Figure 6A:
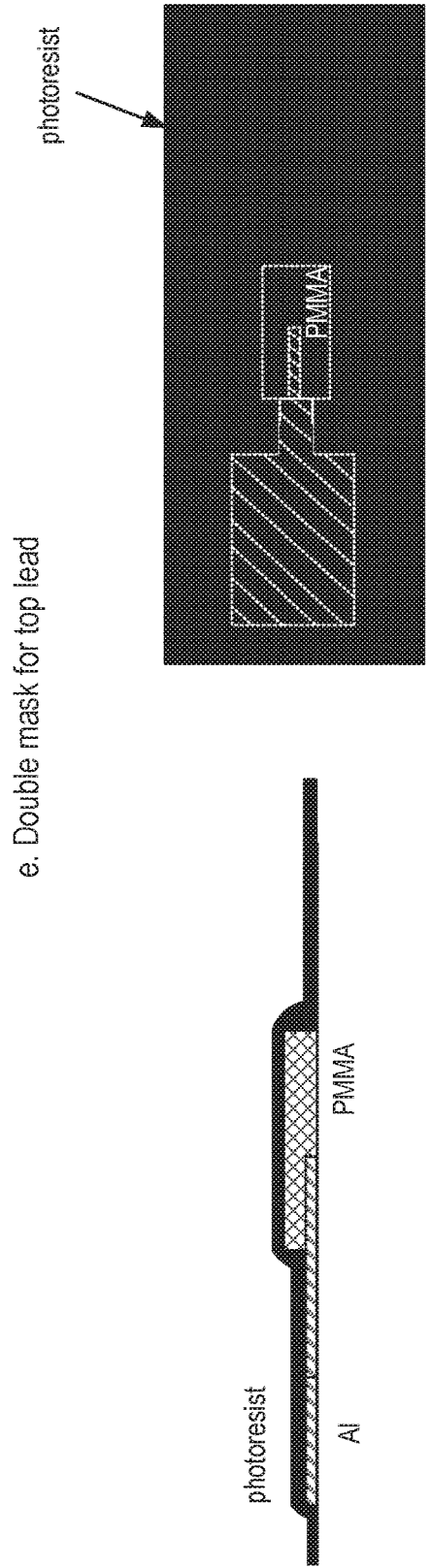

In some embodiments as shown in FIG. 6A, a double mask structure of a top electrode (e.g., of the superconducting qubit) is prepared. In some embodiments, similar to FIG. 5A, the microscopic or nanoscopic structure part (e.g., area 2 corresponding to the superconducting qubit) is covered with an e-beam lithography photoresist (e.g., PMMA). In some embodiments, a macroscopic structure part (e.g., area 5 corresponding to a second part of the superconducting circuit) is covered with an optical photoresist. In some embodiments, the e-beam lithography photoresist and the bottom electrode formed in the previous processes as illustrated in FIGS. 5A-5D may be covered by the optical photoresist as shown in FIG. 6A.

Figure 6B:
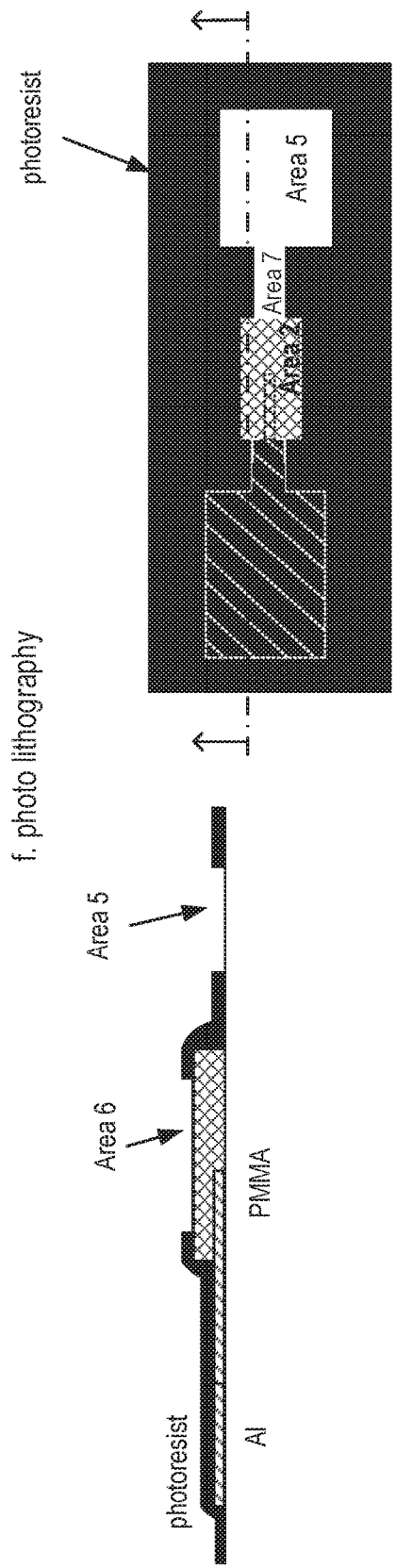

In some embodiments as shown in FIG. 6B, the macroscopic structure interconnected with the top electrode may be defined by photolithography, for example, by exposing and developing a pattern on the optical photoresist to expose area 5. In some embodiments, area 2 covered by the e-beam lithography photoresist (e.g., corresponding to the superconducting qubit) may also be exposed. In some embodiments, an interconnecting area 7 that connects area 2 and area 5 may also be exposed as shown in the top view on the right of FIG. 6B. In some embodiments, area 2, area 5, and the interconnecting area 7 between area 2 and area 5 may be exposed at the same time in one photolithography process.

In some embodiments as shown in FIG. 6C, the location and pattern of the top electrode (e.g., may also be referred to as the top part) of the microscopic or nanoscopic structure (e.g., the superconducting qubit) may be defined using e-beam lithography. For example, as shown in the top view on the right of FIG. 6C, a portion of the e-beam lithography photoresist is removed to expose area 8 (e.g., contained within area 2) corresponding to the top part of the superconducting qubit. In some embodiments, the exposed area 8 overlaps with the bottom part of the superconducting qubit at area 9, Accordingly, the overlapped area 9 is exposed after the e-beam lithography process. In some embodiments, an insulation layer is formed on the metal exposed at the overlapped area 9 by oxidation (e.g., in-situ oxidation). In some embodiments after the oxidation, a top electrode metal (using Al as an example in the figure) may be further deposited. It is appreciated that the top part (e.g., area 8) of the microscopic or nanoscopic structure part (e.g., the superconducting qubit) and the top part (e.g., area 5) of the macroscopic structure part (e.g., the second part of the superconducting circuit) are interconnected and formed in a superconducting layer (e.g., a continuous metal layer formed at the same time during the deposition process). Accordingly, there is no contact interface formed between metals of the superconducting qubit and the second part of the superconducting circuit as described in the conventional problems. In some embodiments as shown in FIG. 6D, the optical photoresist and the e-beam lithography photoresist are removed, and a top electrode pattern can be fabricated by a lift-off process. In some embodiments, after the oxidation, metal deposition and lift-off processes, area 5 corresponding to the top electrode of the second part of the superconducting circuit (e.g., illustrated in FIG. 6B), the interconnecting area 7 between area 2 and area 5 (e.g., illustrated in FIG. 6B), and area 8 corresponding to the top electrode of the superconducting qubit (e.g., illustrated in FIG. 6C) are exposed as a deposited superconducting layer (e.g., Al). As discussed above, area 8, area 7, and area 5 are formed as a continuous metal layer at the same time during the metal deposition process as described in FIG. 6C. As such, the fabrication of the superconducting qubit (e.g., including a top part and a bottom part) and the first part and second part of the superconducting circuit are completed.

It is appreciated that the overlap technique is used as an example of the method for preparing the superconducting qubit part (e.g., the microscopic or nanoscopic structure) in some embodiments of the present disclosure. Other suitable methods can also be used to fabricate the superconducting qubit part, including, for example, the shadow evaporation technique.

In is appreciated that lift-off is used as an example for the method of preparing the first part or second part of the superconducting circuit (e.g., the macroscopic structure) in some embodiments of the present disclosure. Other suitable methods can also be used to fabricate the first part or second part of the superconducting circuit part, including, for example, wet etching or dry etching. It is appreciated that aluminum (Al) is also used as an example for the superconducting material in some embodiments of the present disclosure. Other superconducting materials, such as niobium, niobium nitride, or titanium nitride may also be used as superconducting material.

In some embodiments, the bottom electrode of the superconducting qubit part and the first part of the superconducting circuit part are connected and can be directly prepared by the same metal layer (e.g., as described in FIGS. 5A-5D). Similarly, the top electrode of the superconducting qubit part and the second part of the superconducting circuit part are connected and can be directly prepared by the same metal layer (e.g., as described in FIGS. 6A-6D). Accordingly, by using the double mask technique, integrated fabrication of the superconducting qubit part and the first part of the second part of the superconducting circuit part can be performed, to avoid additional process steps used in conventional methods for preparing a superconducting circuit with interconnection problems. As such, flow processes can be simplified, and the possibility of introducing defects by additional process steps can be reduced. Meanwhile, a superconducting quantum processor prepared using some embodiments of the present disclosure does not have an interface between metal interconnections, and thus may improve the electrical performance.

Figure 7:
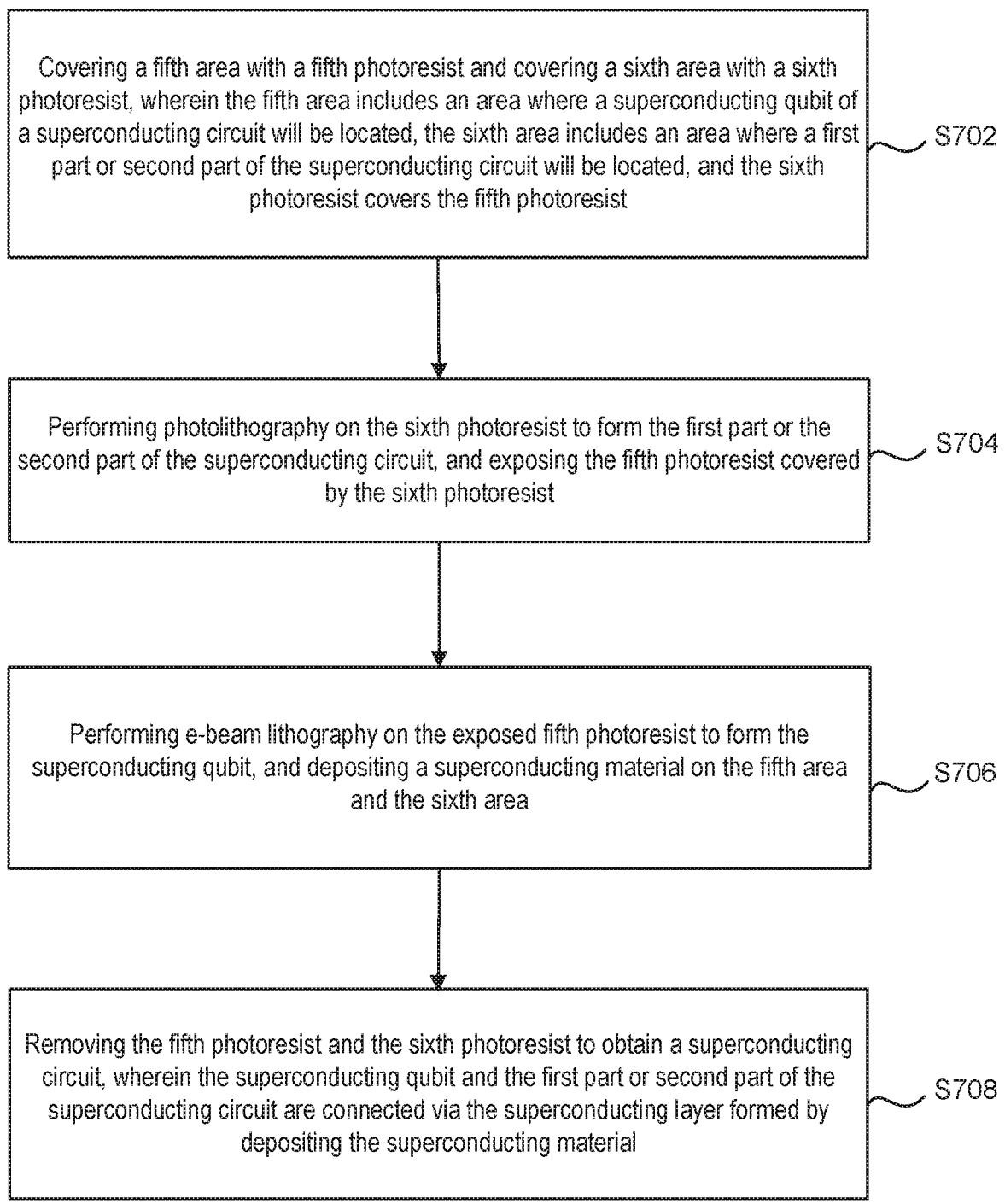
FIG. 7 is a flowchart of an example method for preparing a superconducting circuit according to some embodiments of the present disclosure.

A method for preparing a superconducting circuit as shown in FIG. 7 is provided in this embodiment of the present disclosure. The method for preparing a superconducting circuit is a contactless method for preparing a superconducting circuit, which implements integrated preparation of the superconducting qubit and the first part or second part of the superconducting circuit and avoids an interconnection problem between them. It should be noted that the method for preparing a superconducting circuit provided in this embodiment may be used for preparing a bottom structure of the superconducting circuit and a top structure of the superconducting circuit. The method may also be used simultaneously for preparing the bottom structure and the top structure of the superconducting circuit. That is, it mainly implements high electrical connection between the superconducting qubit part and the first part or second part of the superconducting circuit. The method may implement an integrated fabrication of the superconducting qubit and the first part or second part of the superconducting circuit, and simplify flow processes of the preparation of the superconducting circuit.

FIG. 7 is a flowchart of an example method for preparing a superconducting circuit according to some embodiments of the present disclosure. As shown in FIG. 7, the method includes the following steps S702-S708.

In step S702, a fifth area is covered with a fifth photoresist and a sixth area is covered with a sixth photoresist. The fifth area includes an area where a superconducting qubit of a superconducting circuit will be located, while the sixth area includes an area where a first part or second part of the superconducting circuit will be located. The sixth photoresist may cover the fifth photoresist.

In some embodiments, in step S702, the fifth photoresist may be used to cover the superconducting qubit of the superconducting circuit. The sixth photoresist may be used to cover the first part or second part of the superconducting circuit. The fifth photoresist may be covered by the sixth photoresist.

In some embodiments, the fifth photoresist may include various types of photoresist used for preparing the superconducting qubit, for example, an e-beam lithography photoresist. The sixth photoresist may include various types of photoresist used for preparing the first part or second part of the superconducting circuit, for example, an optical photoresist. It is appreciated that the e-beam lithography photoresist is an example of the photoresist for preparing the superconducting qubit, the optical photoresist is an example of the photoresist for preparing the first part or second part of the superconducting circuit part. In some embodiments, the fifth photoresist and sixth photoresist are not limited to the examples as described in the present disclosure and can include any other suitable material.

In step S704, the first part or second part of the superconducting circuit part is formed through photolithography performed on the sixth photoresist, and the fifth photoresist covered by the sixth photoresist is exposed.

In some embodiments, various suitable techniques may be used when the first part or second part of the superconducting circuit is formed through photolithography performed on the sixth photoresist. For example, the first part or second part of the superconducting circuit part may be formed through photolithography performed on the sixth photoresist using at least one of the following manners: lift-off technique, wet etching technique, and dry etching technique. It is appreciated that the lift-off, wet-etching, and dry etching techniques are similar to the techniques used for photolithography performed on the second photoresist to form the bottom electrode of the first part of the superconducting circuit when preparing the bottom structure of the superconducting circuit, or the techniques used for photolithography performed on the fourth photoresist to form the top electrode of the second part of the superconducting circuit when preparing the top structure of the superconducting circuit. The details are not repeated for the sake of brevity.

In step S706, the superconducting qubit is formed by lithography (e.g., e-beam lithography) on the exposed fifth photoresist, and a superconducting material is deposited on the fifth area and the sixth area.

In some embodiments, various techniques may be used when the superconducting qubit part is formed via lithography performed on the exposed fifth photoresist. For example, the superconducting qubit part may be formed by performing e-beam lithography on the exposed fifth photoresist using at least one of the following methods: overlap technique and shadow evaporation technique. It is appreciated that the overlap technique and the shadow evaporation technique are similar to the techniques used for performing e-beam lithography on the exposed first photoresist to form the bottom part of the superconducting qubit when preparing the bottom structure of the superconducting circuit, or the technique used for performing e-beam lithography on the exposed third photoresist to form the top part of the superconducting qubit when preparing the top structure of the superconducting circuit.

In step S708, the fifth photoresist and the sixth photoresist are removed to obtain a superconducting circuit, wherein the superconducting qubit and the first part or second part of the superconducting circuit are interconnected via the superconducting layer formed by depositing the superconducting material (e.g., in a continuous bottom or top superconducting layer formed in one deposition step).

In some embodiments, the fifth photoresist and the sixth photoresist may be removed to obtain the superconducting circuit by using the lift-off technique as described above in the present disclosure.

In some embodiments, the superconducting material may include various suitable types, for example, may include at least one of the following: aluminum, niobium, niobium nitride, or titanium nitride.

In some embodiments of the present disclosure, the superconducting qubit and other part(s), such as the first part or second part of the superconducting circuit can be connected via a superconducting layer (e.g., a continuous metal layer) formed by depositing the superconducting material (e.g., at the same time in one deposition step). Accordingly, a connection interface between metals can be eliminated, and various technical benefits of the integrated fabrication can be achieved. For example, flow processes of the superconducting circuit can be simplified, and the performance of an electrical connection between the superconducting qubit and other part(s) of the superconducting circuit can be improved. Therefore, the conventional technical problems, e.g., reduced yield of a superconducting circuit due to complex processes, and reduced performance of a superconducting qubit caused by poor quality of an electrical connection at an interface between metals at the interconnection between the superconducting qubit and other part(s) of the superconducting circuit can be solved.

The embodiments may further be described using the following clauses:

1. A superconducting circuit comprising:
   a bottom electrode interconnecting a superconducting qubit and a first part of the superconducting circuit, the bottom electrode comprising:
   a bottom electrode of the superconducting qubit; and
   a bottom electrode of the first part of the superconducting circuit.

2. The superconducting circuit according to clause 1, further comprising a top electrode interconnecting the superconducting qubit and a second part of the superconducting circuit, the top electrode comprising:
   a top electrode of the superconducting qubit; and
   a top electrode of the second part of the superconducting circuit.

3. The superconducting circuit according to any of clauses 1-2, wherein the bottom electrode of the superconducting qubit and the bottom electrode of the first part of the superconducting circuit are formed in a first superconducting layer.

4. The superconducting circuit according to any of clauses 2-3, wherein the top electrode of the superconducting qubit and the top electrode of the second part of the superconducting circuit are formed in a second superconducting layer.

5. The superconducting circuit according to any of clauses 2-4, wherein the first superconducting layer or the second superconducting layer comprises a metal layer or a superconducting compound layer.

6. The superconducting circuit according to any of clause 5, wherein the metal layer or the superconducting compound layer includes at least one of the following: aluminum, niobium, niobium nitride, or titanium nitride.

7. The superconducting circuit according to any of clauses 2-6, wherein an insulation layer is provided on an overlapped area between the bottom electrode and the top electrode.

8. A method for preparing a superconducting circuit, comprising:
   covering a first area with a first photoresist and covering a second area with a second photoresist, wherein the first area comprises an area where a bottom electrode of a superconducting qubit of the superconducting circuit is located, the second area comprises an area where a bottom electrode of a first part of the superconducting circuit is located, and the second photoresist covers the first photoresist;
   performing lithography on the second photoresist to form the bottom electrode of the first part of the superconducting circuit, and to expose the first photoresist covered by the second photoresist;
   performing lithography on the exposed first photoresist to form the bottom electrode of the superconducting qubit;
   depositing first superconducting material on the first area and the second area; and
   removing the first photoresist and the second photoresist to obtain a bottom electrode of the superconducting circuit, wherein the bottom electrode includes the bottom electrode of the superconducting qubit and the bottom electrode of the first part of the superconducting circuit that are formed in a first superconducting layer formed by the deposited first superconducting material.

9. The method according to clause 8, wherein:
   the bottom electrode of the superconducting qubit is formed through lithography performed on the exposed first photoresist using at least one of the following manners: overlap technique or shadow evaporation technique;
   the bottom part of the first part of the superconducting circuit is formed through lithograph performed on the second photoresist using at least one of the following manners: lift-off technique, wet etching technique, or dry etching technique; and
   the first photoresist comprises an e-beam lithography photoresist, and the second photoresist comprises an optical photoresist.

10. The method according to any of clauses 8-9, further comprising:
    covering a third area with a third photoresist and covering a fourth area with a fourth photoresist based on the bottom electrode of the superconducting circuit, wherein the third area comprises an area where a top electrode of the superconducting qubit of the superconducting circuit is located, the fourth area comprises an area where a top electrode of the second part of the superconducting circuit is located, and the fourth photoresist covers the third photoresist;
    performing lithography on the fourth photoresist to form the top electrode of the second part of the superconducting circuit, and to expose the third photoresist covered by the fourth photoresist;
    performing lithography on the exposed third photoresist to form the top electrode of the superconducting qubit;
    preparing an insulation layer at an overlapped area between the top electrode and the bottom electrode of the superconducting qubit;
    depositing second superconducting material on the third area and the fourth area; and
    removing the third photoresist and the fourth photoresist to obtain a top electrode of the superconducting circuit, wherein the top electrode includes the top electrode of the superconducting qubit and the top electrode of the second part of the superconducting circuit that are formed in a second superconducting layer formed by the deposited second superconducting material.

11. The method according to clause 10, wherein
    the top electrode of the superconducting qubit is formed through lithography performed on the exposed third photoresist using at least one of the following manners: overlap technique or shadow evaporation technique;
    the top electrode of the second part of the superconducting circuit is formed through lithography performed on the fourth photoresist using at least one of the following manners: lift-off technique, wet etching technique, or dry etching technique; and
    the third photoresist comprises an e-beam lithography photoresist, and the fourth photoresist comprises an optical photoresist.

12. The method according to any of clauses 10-11, wherein the first superconducting material or the second superconducting material comprise(s) at least one of the following: aluminum, niobium, niobium nitride, or titanium nitride.

13. A method for preparing a superconducting circuit, comprising:

covering a first area with a first photoresist and covering a second area with a second photoresist, wherein the first area comprises an area where a superconducting qubit of the superconducting circuit is located, the second area comprises an area where a part of the superconducting circuit is located, and the second photoresist covers the first photoresist;

performing lithography on the second photoresist to form the part of the superconducting circuit, and to expose the first photoresist covered by the second photoresist;

performing lithography on the exposed first photoresist to form the superconducting qubit;

depositing superconducting material on the first area and the second area; and removing the first photoresist and the second photoresist to obtain the superconducting circuit, wherein the superconducting qubit and the part of the superconducting circuit are connected via a superconducting layer formed by the deposited superconducting material.

14. The method according to clause 13, wherein the superconducting qubit is formed through lithography performed on the exposed first photoresist using at least one of the following manners: overlap technique or shadow evaporation technique; and the part of the superconducting circuit is formed through lithography performed on the second photoresist using at least one of the following manners: lift-off technique, wet etching technique, or dry etching technique.

15. The method according to any of clauses 13-14, wherein the first photoresist comprises an e-beam lithography photoresist, and the second photoresist comprises an optical photoresist.

16. The method according to any of clauses 13-15, wherein the superconducting material comprises at least one of the following: aluminum, niobium, niobium nitride, or titanium nitride.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

It should be noted that, for simplicity of description, the foregoing various method embodiments are all described as a combination of a series of steps. However, those skilled in the art should know that the present disclosure is not limited to the described order of steps, because some steps may be executed in another order or simultaneously according to the present disclosure. Moreover, those skilled in the art should also know that the embodiments described in the description are all preferred embodiments, and the steps involved are not necessarily required to the present disclosure.

The aforementioned sequence numbers of the embodiments of the present disclosure are merely for convenience of description, and do not imply the preference among the embodiments.

In the aforementioned embodiments of the present disclosure, the description of each embodiment has its own emphasis, and for a part that is not detailed in a certain embodiment, reference can be made to the related description of other embodiments.

In some embodiments provided in this application, it should be understood that the disclosed technical contents may be implemented in other manners. The apparatus embodiments described in the foregoing are merely schematic. For example, the division of units is merely division of logic functions, and in fact, there may be other division manners during implementation. For example, multiple units or components may be combined or may be integrated into another system, or some features may be omitted or not be executed. In addition, the displayed or discussed mutual couplings or direct couplings or communication connections may be implemented through some interfaces, and the indirect couplings or communication connections between units or modules may be implemented in electrical or other forms.

The units described as separate parts may or may not be physically separate, and the parts shown as units may or may not be physical units. Namely, they can be either located in one place or distributed onto multiple network units. Part or all of the units can be chosen to implement the purpose of the solutions of this embodiment according to actual requirements.

In addition, respective functional units in various embodiments of the present disclosure may be integrated into one processing unit, or respective units may physically exist alone, or two or more units may be integrated into one unit.

The above descriptions are merely preferred implementations of the present disclosure. It should be pointed out that those of ordinary skill in the art can make several improvements and modifications without departing from the principle of the present application, and the improvements and modifications should also be construed as falling within the protection scope of the present disclosure.

The invention claimed is:

1. A superconducting circuit comprising:
a bottom electrode interconnecting a superconducting qubit and a first part of the superconducting circuit, the bottom electrode comprising:
a bottom electrode of the superconducting qubit; and
a bottom electrode of the first part of the superconducting circuit, wherein the bottom electrode of the first part of the superconducting circuit is integrally formed with the bottom electrode of the superconducting circuit.

2. The superconducting circuit according to claim 1, further comprising a top electrode interconnecting the superconducting qubit and a second part of the superconducting circuit, the top electrode comprising:
a top electrode of the superconducting qubit; and
a top electrode of the second part of the superconducting circuit.

3. The superconducting circuit according to claim 1, wherein the bottom electrode of the superconducting qubit and the bottom electrode of the first part of the superconducting circuit are formed in a first superconducting layer.

4. The superconducting circuit according to claim 3, wherein the top electrode of the superconducting qubit and the top electrode of the second part of the superconducting circuit are formed in a second superconducting layer.

5. The superconducting circuit according to claim 4, wherein the first superconducting layer or the second superconducting layer comprises a metal layer or a superconducting compound layer.

6. The superconducting circuit according to claim 5, wherein the metal layer or the superconducting compound layer includes at least one of the following: aluminum, niobium, niobium nitride, or titanium nitride.

7. The superconducting circuit according to claim 2, wherein an insulation layer is provided on an overlapped area between the bottom electrode and the top electrode.

* * * * *